(12) United States Patent
Byun

(10) Patent No.: US 12,179,471 B2
(45) Date of Patent: Dec. 31, 2024

(54) DISPLAY DEVICE AND METHOD OF MANUFACTURING THE SAME

(71) Applicant: Samsung Display Co., LTD., Yongin-si (KR)

(72) Inventor: Ho Yun Byun, Osan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 728 days.

(21) Appl. No.: 17/205,518

(22) Filed: Mar. 18, 2021

(65) Prior Publication Data
US 2021/0332271 A1    Oct. 28, 2021

(30) Foreign Application Priority Data
Apr. 22, 2020    (KR) .................... 10-2020-0048687

(51) Int. Cl.
*B32B 7/12*        (2006.01)
*B41M 5/00*        (2006.01)
(Continued)

(52) U.S. Cl.
CPC ............ *B32B 7/12* (2013.01); *B41M 5/0047* (2013.01); *C09J 133/08* (2013.01);
(Continued)

(58) Field of Classification Search
CPC ............ C09J 2203/318; C09J 2301/208; C09J 2301/1242; B32B 7/12; G02B 5/3033; G02F 1/133528; G02F 1/133331
See application file for complete search history.

(56) References Cited

U.S. PATENT DOCUMENTS

| 11,073,924 B2 | 7/2021 | Kim |
| 2007/0188688 A1* | 8/2007 | Hwang ............ G02F 1/133351 349/122 |

(Continued)

FOREIGN PATENT DOCUMENTS

| KR | 10-2012-0023065 | 3/2012 |
| KR | 10-2014-0096596 | 8/2014 |

(Continued)

OTHER PUBLICATIONS

"Surface Energy" [online]. Wikipedia. Last edited on May 10, 2024 [retrieved on Sep. 5, 2024]. Retrieved from the Internet: <URL: https://en.wikipedia.org/wiki/Surface_energy> (Year: 2024).*

(Continued)

*Primary Examiner* — Sophie Hon
*Assistant Examiner* — Sow-Fun Hon
(74) *Attorney, Agent, or Firm* — KILE PARK REED & HOUTTEMAN PLLC

(57) ABSTRACT

A display device may include a display panel, a lower deposition layer disposed on the display panel, a first adhesive layer disposed on the lower deposition layer, a second adhesive layer disposed on the first adhesive layer and having a different surface energy than the first adhesive layer; and an upper deposition layer disposed on the second adhesive layer. An absolute value of the difference between the surface energy of the lower deposition layer and the first adhesive layer is less than an absolute value of a difference between the surface energy of the lower deposition layer and the second adhesive layer. An absolute value of a difference between the surface energy of the upper deposition layer and the second adhesive layer is less than an absolute value of a difference between the surface energy of the upper deposition layer and the first adhesive layer.

19 Claims, 5 Drawing Sheets

(51) Int. Cl.
  *C09J 133/08* (2006.01)
  *G02B 5/30* (2006.01)
  *H10K 50/86* (2023.01)
  *H10K 59/00* (2023.01)

(52) U.S. Cl.
  CPC ........ *G02B 5/3033* (2013.01); *B32B 2457/20* (2013.01); *C09J 2203/318* (2013.01); *H10K 50/86* (2023.02); *H10K 59/00* (2023.02)

(56) References Cited

U.S. PATENT DOCUMENTS

| | | | |
|---|---|---|---|
| 2012/0064338 A1 | 3/2012 | Niimi et al. | |
| 2014/0211105 A1 | 7/2014 | Cho | |
| 2016/0340559 A1* | 11/2016 | Jiang | B32B 37/12 |
| 2020/0116898 A1* | 4/2020 | Oh | A61B 5/14552 |

FOREIGN PATENT DOCUMENTS

| | | |
|---|---|---|
| KR | 10-2015-0025975 | 3/2015 |
| KR | 10-2018-0037108 | 4/2018 |
| KR | 10-2019-0102872 | 9/2019 |
| KR | 10-2019-0130490 | 11/2019 |
| WO | WO-2018117710 A1 * 6/2018 | ........... A61B 5/0086 |

OTHER PUBLICATIONS

"What is the Difference Between Surface Tension and Surface Energy" [online]. Brighton Science. Mar. 2021 [retrieved on Sep. 5, 2024]. Retrieved from the Internet: <URL: https://www.brighton-science.com/blog/what-is-the-difference-between-surface-tension-and-surface-energy-1> (Year: 2021).*

"What is Surface Energy, and Why is it Important in Bonding?" [online]. Can-Do National Tape. Posted Mar. 17, 2016 [retrieved on Sep. 5, 2024]. Retrieved from the Internet: <URL: https://www.can-dotape.com/blog/what-is-surface-energy-and-why-is-it-important-in-bonding/> (Year: 2016).*

Korean Office Action with English translation for Korean Patent Application No. 10-2020-0048687, dated Apr. 29, 2024.

* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0048687 under 35 USC § 119, filed on Apr. 22, 2020 in the Korean Intellectual Property Office (KIPO), the disclosure of which is incorporated by reference herein in its entirety.

BACKGROUND

1. Field

Embodiments relate to a display device and method of manufacturing the same. The embodiments relate to a display device including an adhesive layer and method of manufacturing the same.

2. Description of the Related Art

Flat panel display device have been used as a display device replacing cathode ray tube display devices due to characteristics such as light weight and thinness. Examples of flat panel display devices may include liquid crystal display devices and organic light emitting display devices.

The display device may include a display panel. Multiple layers (e.g., a polarizing layer, a window, etc.) may be disposed on the display panel. An adhesive layer may be disposed between the layers to adhere the layers to each other.

Therefore, there is a need to develop a method to effectively adhere the layers to each other.

SUMMARY

Embodiments provide a display device including an adhesive layer and a method of manufacturing the display device.

A display device according to an embodiment may include a display panel, a lower deposition layer disposed on the display panel, a first adhesive layer disposed on the lower deposition layer, a second adhesive layer disposed on the first adhesive layer and having a surface energy different than a surface energy of the first adhesive layer and an upper deposition layer disposed on the second adhesive layer. An absolute value of a difference between a surface energy of the lower deposition layer and the surface energy of the first adhesive layer may be less than an absolute value of a difference between the surface energy of the lower deposition layer and the surface energy of the second adhesive layer. An absolute value of a difference between a surface energy of the upper deposition layer and the surface energy of the second adhesive layer may be less than an absolute value of a difference between the surface energy of the upper deposition layer and the surface energy of the first adhesive layer.

In an embodiment, the lower deposition layer may include a polarizing layer. The upper deposition layer may include a window.

In an embodiment, the lower deposition layer may include a polarizing layer and a buffer layer disposed on the polarizing layer. The upper deposition layer may include a window.

In an embodiment, a minimum thickness of the first adhesive layer may be about 5 um. A minimum thickness of the second adhesive layer may be about 5 um.

In an embodiment, a thickness ratio of a thickness of the first adhesive layer and a thickness of the second adhesive layer may be in a range of about 1:19 to about 19:1.

In an embodiment, the first adhesive layer and the second adhesive layer include an acrylic composition.

A method of manufacturing a display device according to an embodiment may include forming a lower deposition layer on a display panel, forming a first adhesive layer on the lower deposition layer, forming a second adhesive layer on the first adhesive layer, and forming an upper deposition layer on the second adhesive layer. An absolute value of a difference between a surface energy of the lower deposition layer and a surface energy of the first adhesive layer may be less than an absolute value of a difference between the surface energy of the lower deposition layer and a surface energy of the second adhesive layer. An absolute value of a difference between a surface energy of the upper deposition layer and the surface energy of the second adhesive layer may be less than an absolute value of a difference between the surface energy of the upper deposition layer and the surface energy of the first adhesive layer.

In an embodiment, the forming of the first adhesive layer may include providing a first adhesive composition on the lower deposition layer, and firstly curing the first adhesive composition.

In an embodiment, the forming the second adhesive layer may include providing the second adhesive composition on the first adhesive layer, and firstly curing the second adhesive composition.

In an embodiment, the method may further include secondly curing the first adhesive layer and the second adhesive layer.

In an embodiment, the firstly curing of the first adhesive composition, the firstly curing of the second adhesive composition and the secondly curing of the first adhesive layer and the second adhesive layer may be performed using ultraviolet rays.

In an embodiment, the method may further include modifying a surface of the lower deposition layer before the forming of the first adhesive layer. The surface of the lower deposition layer may contact the first adhesive layer.

In an embodiment, the method may further include modifying a surface of the upper deposition layer before the forming of the upper deposition layer on the second adhesive layer. The surface of the upper deposition layer may contact the second adhesive layer.

In an embodiment, the method may further include modifying a surface of the lower deposition layer before forming the first adhesive layer, and modifying a surface of the upper deposition layer before forming the upper deposition layer on the second adhesive layer. The surface of the lower deposition layer may contact the first adhesive layer, and the surface of the upper deposition layer may contact the second adhesive layer.

In an embodiment, the forming of the first adhesive layer and the forming of the second adhesive layer may be performed through an inkjet printing process.

In an embodiment, the inkjet printing process may be performed using a discharge device including a first discharge port for discharging the first adhesive composition and a second discharge port for discharging the second adhesive composition.

In an embodiment, the discharge device may include a first storage part connected to the first discharge port and a second storage part connected to the second discharge port.

In an embodiment, each of a viscosity of the first adhesive composition and a viscosity of the second adhesive composition may be about 5 cP to about 40 cP.

In an embodiment, a contact angle between the first adhesive composition and the lower deposition layer may be about 10 degrees or less.

In an embodiment, a contact angle between the second adhesive composition and the upper deposition layer may be about 10 degrees or less.

A display device according to an embodiment may include a display panel, a lower deposition layer disposed on the display panel, a first adhesive layer disposed on the lower deposition layer, a second adhesive layer disposed on the first adhesive layer and having a surface energy different than a surface energy of the first adhesive layer and an upper deposition layer disposed on the second adhesive layer. An absolute value of a difference between a surface energy of the lower deposition layer and the surface energy of the first adhesive layer is less than an absolute value of a difference between the surface energy of the lower deposition layer and the surface energy of the second adhesive layer. An absolute value of a difference between a surface energy of the upper deposition layer and the surface energy of the second adhesive layer is less than an absolute value of a difference between the surface energy of the upper deposition layer and the surface energy of the first adhesive layer.

The lower deposition layer and the upper deposition layer may be more effectively adhered to each other than when the lower deposition layer and the upper deposition layer are adhered using a single adhesive layer. By lowering a difference between the surface energy of the lower deposition layer and the surface energy of the first adhesive layer, the lower deposition layer and the first adhesive layer may be effectively adhered to each other. By lowering a difference between the surface energy of the upper deposition layer and the surface energy of the second adhesive layer, the upper deposition layer and the second adhesive layer may be effectively adhered to each other.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
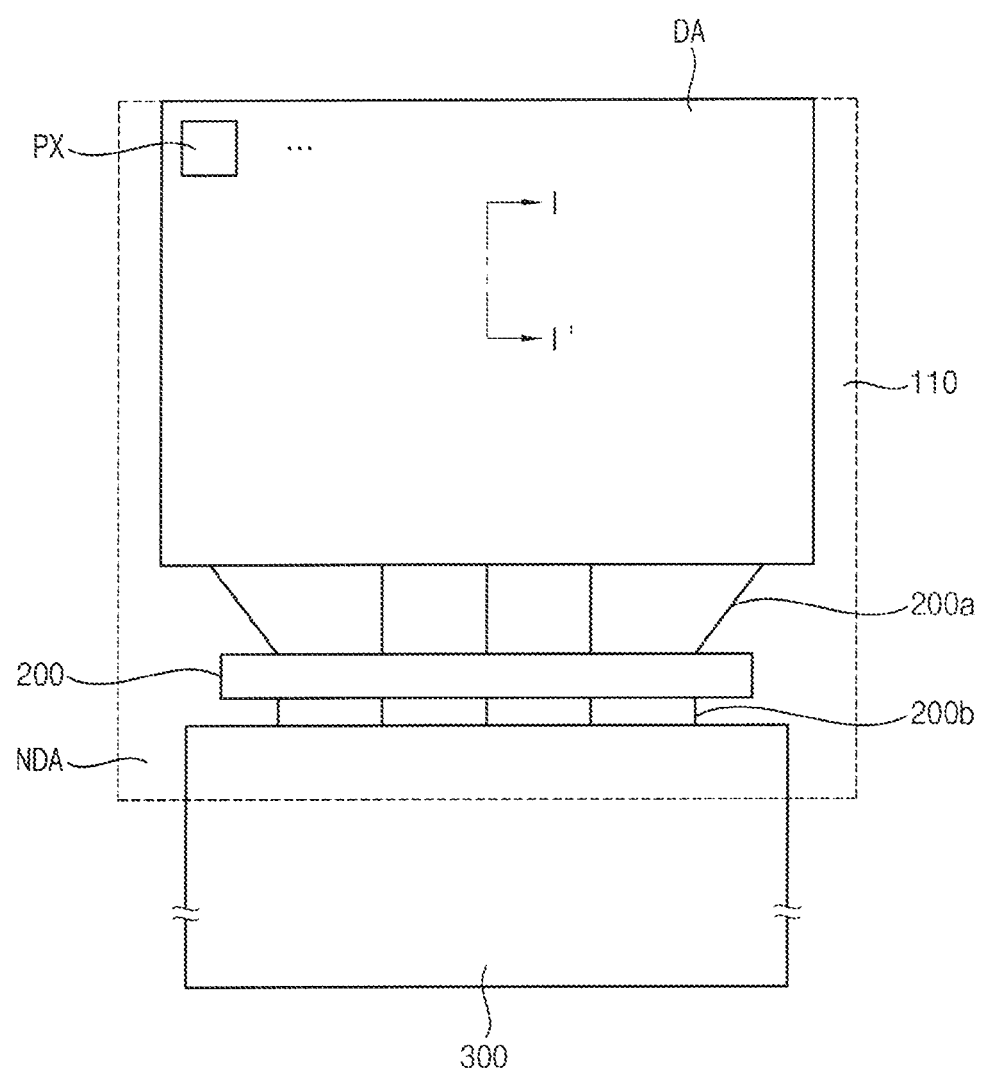
FIG. 1 is a schematic plan view illustrating a display device according to an embodiment.

Hereinafter, display devices and methods of manufacturing display devices in accordance with embodiments will be explained in detail with reference to the accompanying drawings.

The drawings and description are to be regarded as only illustrative in nature, and thus are not limiting of embodiments described and claimed herein. Some of the parts which are not associated with the description may not be provided in order to describe embodiments of the invention and like reference numerals refer to like elements throughout the specification.

In the drawings, a size and thickness of each element are arbitrarily represented for better understanding and ease of description, however the invention is not limited thereto. In the drawings, the thickness of layers, films, panels, regions, and other elements may be exaggerated for clarity. In the drawings, for better understanding and ease of description, the thicknesses of some layers and areas may be exaggerated.

In the specification, the phrase "in a plan view" means when an object portion is viewed from above, and the phrase "in a cross-sectional view" means when a cross-section taken by vertically cutting an object portion is viewed from the side.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Throughout the specification, when an element is referred to as being "connected" to another element, the element may be "directly connected" to another element, or with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
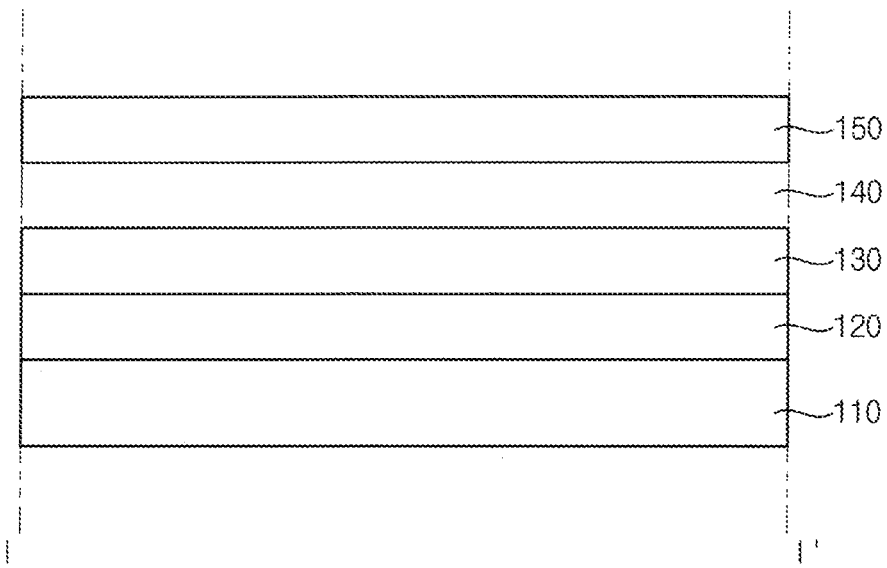
FIG. 2 is a schematic cross-sectional view illustrating an embodiment of the display device of FIG. 1 cut along the line I-I'.

FIG. 1 is a schematic plan view illustrating a display device according to an embodiment, and FIG. 2 is a schematic cross-sectional view illustrating an embodiment of the display device of FIG. 1 cut along the line I-I'.

Referring to FIGS. 1 and 2, the display device may include a display panel 110, a lower deposition layer 120, a first adhesive layer 130, a second adhesive layer 140, an upper deposition layer 150, a driver 200, a circuit film 300, multiple fan-out wirings 200a, multiple transfer wirings 200b, and multiple pixels PX.

The display panel 110 may include a display area DA and a non-display area NDA surrounding the display area DA. The display panel 110 may include the pixels PX. Each of the pixels PX may include a first electrode, a light emitting layer, and a second electrode. The pixels PX may be entirely arranged in the display area DA in a matrix form. However, the embodiments are not limited thereto, and the pixels PX may be arranged in various forms in the display area DA. The display device may display an image on the display area DA through the pixels PX. The display panel 110 may include an organic light emitting display panel. However, the embodiments are not limited thereto, and the display panel 110 may include a liquid crystal display panel, an electrophoretic display panel, and a plasma display panel.

The driver 200 may be disposed in the non-display area NDA of the display panel 110. The driver 200 may be disposed on one side of the display area DA. The driver 200 may transmit signals (e.g., a data signal, a power voltage, etc.) to the display area DA through the fan-out wirings 200a. The driver 200 may receive the signals generated from an external device through the transfer wirings 200b. The driver 200 may transmit the signals to the display area DA through the fan-out wirings 200a. In FIG. 1, it is illustrated that the driver 200 is disposed in the non-display area NDA on the display panel 110, but is not limited thereto. For example, the driver 200 may be disposed on the circuit film 300. The fan-out wirings 200a may be disposed on the non-display area NDA of the display panel 110. The fan-out wirings 200a may be disposed between the display area DA and the driver 200. The fan-out wirings 200a may electrically connect the driver 200 and the pixels PX. The fan-out wirings 200a may include data signal wirings, power voltage wirings, and the like.

The lower deposition layer 120 may be disposed on the display panel 110. In an embodiment, the lower deposition layer 120 may include a polarizing layer for preventing reflection of external light. The polarizing layer may reduce reflection of the external light to improve visibility of the display device.

The first adhesive layer 130 may be disposed on the lower deposition layer 120. The first adhesive layer 130 may be generally disposed on the lower deposition layer 120. The first adhesive layer 130 may be made of a transparent material. For example, the first adhesive layer 130 may be formed of an optical transparent resin (OCR), an optical clear adhesive (OCA), or a combination thereof. The first adhesive layer 130 may include an acrylic composition. For example, the first adhesive layer 130 may include an epoxy acrylate-based resin, a polyester acrylate-based resin, a urethane acrylate-based resin, a polybutadiene acrylate-based resin, silicon acrylate-based resin, alkyl acrylate-based resin, and the like. However, the embodiments are not limited thereto, and the first adhesive layer 130 may include other adhesive materials as well.

In an embodiment, the first adhesive layer 130 may further include hydrophilic materials or hydrophobic materials (e.g., fluoride) to control a surface energy of the first adhesive layer 130. Hydrophilic materials may increase the surface energy of the first adhesive layer 130. Hydrophobic materials may lower the surface energy of the first adhesive layer 130.

In an embodiment, a modified acrylic resin may be used to control the surface energy of the first adhesive layer 130. For example, a fluorine-containing acrylic resin may be used to lower the surface energy. The surface energy can be controlled by adjusting the fluorine content of the fluorine-containing acrylic resin. The acrylic resin may contain a hydroxyl group in order to increase the surface energy. The surface energy may be controlled by adjusting the hydroxyl group content of the acrylic resin.

A surface of the lower deposition layer 120 in contact with the first adhesive layer 130 may be modified. A surface of the upper deposition layer 150 in contact with the second adhesive layer 140 may not be modified. When the modification is performed, the surface energy of the lower deposition layer 120 in contact with the first adhesive layer 130 may be changed. For example, the modification may include a plasma surface treatment. The modification may also include a corona discharge treatment.

The second adhesive layer 140 may be disposed on the first adhesive layer 130. The second adhesive layer 140 may be generally disposed on the first adhesive layer 130. The second adhesive layer 140 may be made of a transparent material. For example, the second adhesive layer 140 may be formed of an optical transparent resin (OCR), an optical clear adhesive (OCA), or a combination thereof. The second adhesive layer 140 may include an acrylic composition. For example, the second adhesive layer 140 may include an epoxy acrylate-based resin, a polyester acrylate-based resin, a urethane acrylate-based resin, a polybutadiene acrylate-based resin, silicon acrylate-based resin, alkyl acrylate-based resin, and the like. However, the embodiments are not limited thereto, and the second adhesive layer 140 may include other adhesive materials as well.

In an embodiment, the second adhesive layer 140 may include hydrophilic materials or hydrophobic materials to control surface energy. Hydrophilic materials may increase the surface energy of the second adhesive layer 140. Hydrophobic material may lower the surface energy of the second adhesive layer 140. In an embodiment, the surface energy of the first adhesive layer 130 and the second adhesive layer 140 may be different.

The upper deposition layer 150 may be disposed on the second adhesive layer 140. In an embodiment, the upper deposition layer 150 may include a window. The window may be made of a transparent material. For example, the window may be made of glass, acrylic, polycarbonate, polyimide, polymethylmethacrylate, or a combination thereof. In an embodiment, the window may be a touch screen panel.

In an embodiment, the surface of the upper deposition layer 150 in contact with the second adhesive layer 140 may be modified. The surface of the lower deposition layer 120 in contact with the first adhesive layer 130 may not be modified. When the modification is performed, the surface energy of the upper deposition layer 150 in contact with the second adhesive layer 140 may be changed. For example, the modification may include a plasma surface treatment. The modification may also include a corona discharge treatment. The first adhesive layer 130 may adhere the lower deposition layer 120 and the upper deposition layer 150 together with the second adhesive layer 140.

In the embodiments, the surface of the upper deposition layer 150 in contact with the second adhesive layer 140, and the surface of the lower deposition layer 120 in contact with the first adhesive layer 130 may be modified. When the modification is performed, the surface energy of the lower deposition layer 120 in contact with the first adhesive layer 130 and the surface energy of the upper deposition layer 150 in contact with the second adhesive layer 140 may be changed. For example, the modification may include a plasma surface treatment. The modification may also include corona discharge treatment.

The first adhesive layer 130 and the second adhesive layer 140 may be formed by curing an adhesive composition in a liquid or semi-solid state. In an embodiment, the first adhesive layer 130 and the second adhesive layer 140 may be formed by photocuring. The adhesive composition may be cured when the adhesive composition including a photocurable material such as a photo initiator is irradiated with light such as ultraviolet rays. For example, the adhesive composition may be cured with a monomer and/or intermediate as a polymer.

The thickness of the first adhesive layer 130 and the thickness of the second adhesive layer 140 may be different according to the types of materials included in the first adhesive layer 130 and the second adhesive layer 140. In an embodiment, the thickness of the first adhesive layer 130 may be about 1 times to about 19 times the thickness of the second adhesive layer 140. In an embodiment, the thickness of the second adhesive layer 140 may be about 1 times to about 19 times the thickness of the first adhesive layer 130. Preferably, the thickness of the first adhesive layer 130 and the thickness of the second adhesive layer 140 may be about the same. In an embodiment, the minimum thickness of the first adhesive layer 130 may be about 5 μm. The minimum thickness of the second adhesive layer 140 may also be about 5 μm.

The smaller the difference in surface energy between the adhesive layer and the deposition layer (e.g., the lower deposition layer 120 and the first adhesive layer 130), the better for adhesion. In an embodiment, an absolute value of the difference between the surface energy of the lower deposition layer 120 and the surface energy of the first adhesive layer 130 may be smaller than an absolute value of the difference between the surface energy of the lower deposition layer 120 and the surface energy of the second adhesive layer 140. An absolute value of the difference between the surface energy of the upper deposition layer 150 and the surface energy of the second adhesive layer 140 may be smaller than an absolute value of the difference between the surface energy of the upper deposition layer 150 and the surface energy of the first adhesive layer 130.

The lower deposition layer 120 and the upper deposition layer 150 can be more effectively adhered to each other than when the lower deposition layer 120 and the upper deposition layer 150 are adhered using a single adhesive layer. By lowering the difference between the surface energy of the lower deposition layer 120 and the surface energy of the first adhesive layer 130, the lower deposition layer 120 and the first adhesive layer 130 can be effectively adhered to each other. By lowering the difference between the surface energy of the upper deposition layer 150 and the surface energy of the second adhesive layer 140, the upper deposition layer 150 and the second adhesive layer 120 can be effectively adhered to each other. In an embodiment, the difference in surface energy between the adhesive layers and the deposition layers may be adjusted through the modifications.

Figure 3:
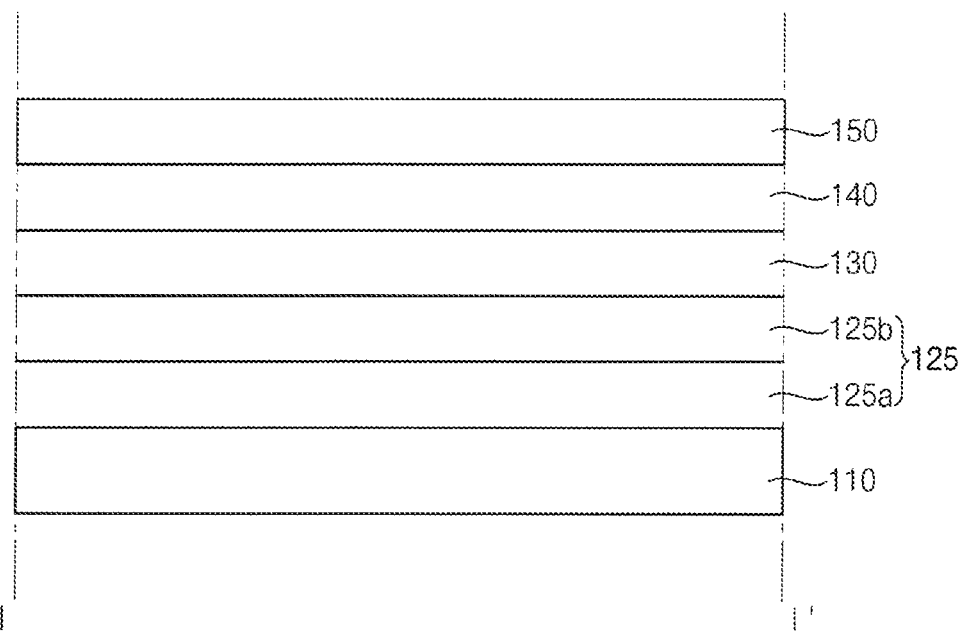
FIG. 3 is a schematic cross-sectional view illustrating an embodiment of the display device of FIG. 1 cut along the line I-I'.

FIG. 3 is a schematic cross-sectional view illustrating an embodiment of the display device of FIG. 1 cut along the line I-I'. The display device of FIG. 3 may be substantially the same as the display device of FIG. 2 except for the lower deposition layer 125 of the display device of FIG. 2.

Referring to FIGS. 1 and 3, the display device may include the lower deposition layer 125. The lower deposition layer 125 may be disposed on the display panel 110. The lower deposition layer 125 may be formed as a single layer, or may be formed by stacking multiple layers with each other. For example, the lower deposition layer 125 may include a polarizing layer 125a disposed on the display panel 110. The lower deposition layer 125 may further include a buffer layer 125b disposed on the polarizing layer 125a. The buffer layer 125b may absorb or disperse an external shock. In an embodiment, the buffer layer 125b may include a structure in which multiple thin film layers are stacked with each other. The buffer layer 125b may absorb or disperse the shock applied from the outside through this.

The first adhesive layer 130 may be disposed on the lower deposition layer 125. The first adhesive layer 130 may be generally disposed on the buffer layer 125b. In an embodiment, the surface of the buffer layer 125b in contact with the first adhesive layer 130 may be modified. In an embodiment, the surface of the upper deposition layer 150 adhered to the second adhesive layer 140 may also be modified. In an embodiment, the surface of the buffer layer 125b in contact with the first adhesive layer 130 and the surface of the upper deposition layer 150 adhered to the second adhesive layer 140 may be modified. For example, the modification may include a plasma surface treatment. The modification may also include corona discharge treatment.

The smaller the difference in surface energy between the adhesive layer and the deposition layer (e.g., the upper deposition layer 150 and the second adhesive layer 140), the better for adhesion. In an embodiment, an absolute value of the difference between the surface energy of the buffer layer 125b and the surface energy of the first adhesive layer 130 may be smaller than an absolute value of the difference between the surface energy of the buffer layer 125b and the surface energy of the second adhesive layer 140. An absolute value of the difference between the surface energy of the upper deposition layer 150 and the surface energy of the second adhesive layer 140 may be smaller than an absolute value of the difference between the surface energy of the upper deposition layer 150 and the surface energy of the buffer layer 125b. The buffer layer 125b and the upper deposition layer 150 can be more effectively adhered to each other than when the buffer layer 125b and the upper deposition layer 150 are adhered using a single adhesive layer.

By lowering the difference between the surface energy of the buffer layer 125b and the surface energy of the first adhesive layer 130, the buffer layer 125b and the first adhesive layer 130 can be effectively adhered to each other. By lowering the difference between the surface energy of the upper deposition layer 150 and the surface energy of the second adhesive layer 140, the upper deposition layer 150 and the second adhesive layer 120 can be effectively adhered to each other. In an embodiment, the difference in surface energy between the adhesive layers and the deposition layers may be adjusted through the modifications.

FIGS. 4A to 4E are diagrams illustrating a method of manufacturing the display device of FIG. 1.

Figure 4A:
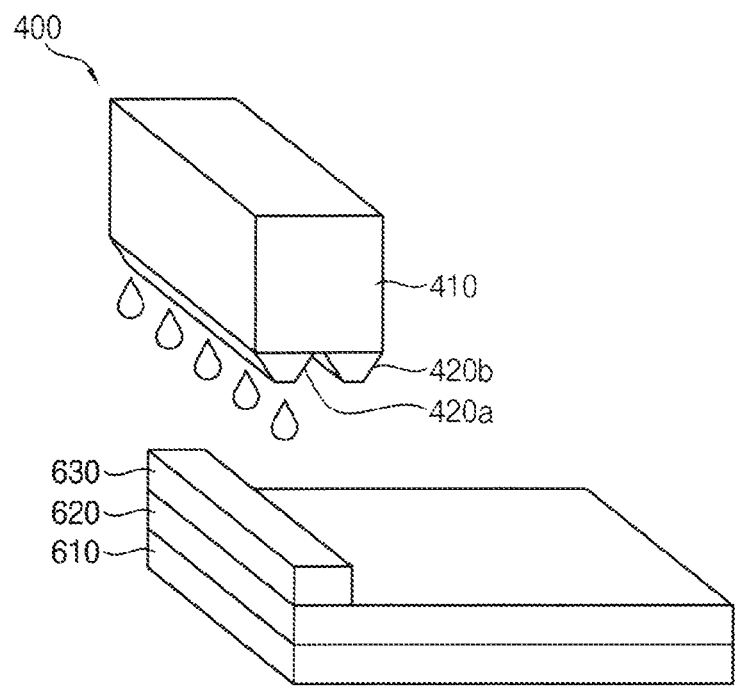
FIGS. 4A to 4E are diagrams illustrating a method of manufacturing the display device of FIG. 1.

Referring to FIG. 4A, a lower deposition layer 620 may be formed on a display panel 610. In an embodiment, the lower deposition layer 620 may include the polarizing layer. In an embodiment, the lower deposition layer 620 may include the polarizing layer and a buffer layer formed on the polarizing layer.

A first adhesive layer 630 may be formed by providing the first adhesive composition on the lower deposition layer 620. In an embodiment, the providing of the first adhesive composition may be performed through an inkjet printing process. However, the embodiments are not limited thereto, and the providing of the first adhesive composition may be performed using processes such as inkjet injection, slot dye coating, slot dye printing, and the like. The first adhesive compositions having various surface energies may be provided by using the inkjet printing process.

The first adhesive layer 630 may be made of a transparent material. For example, the first adhesive layer 630 may be formed of an optically transparent resin (OCR), an optically transparent adhesive (OCA), or a combination thereof. The first adhesive layer 630 may include the photocurable material. In an embodiment, the first adhesive layer 630 may include an epoxy acrylate resin, a polyester acrylate resin, a urethane acrylate resin, a polybutadiene acrylate resin, silicone acrylate resin, alkyl acrylate resin, and the like. However, the embodiments are not limited thereto, and the first adhesive layer 630 may include other adhesive materials as well. In an embodiment, the first adhesive layer 630 may include a hydrophilic material or a hydrophobic material (e.g., fluoride) to control the surface energy of the first adhesive layer 630. The hydrophilic material may increase the surface energy of the first adhesive layer 630. The hydrophobic material may lower the surface energy of the first adhesive layer 630.

A discharge device 400 may provide the first adhesive composition on the lower deposition layer 620. The discharge device 400 may include a storage part 410, a first discharge port 420a, and a second discharge port 420b. In an embodiment, the discharge device 400 may be a device for performing an inkjet printing process. In an embodiment, the discharge device 400 may provide the first adhesive composition having the first surface energy through the first discharge port 420a. The discharge device 400 may provide a second adhesive composition having a second surface energy different from the first surface energy through the second discharge port 420b. The storage part 410 may include a divided storage space. In an embodiment, the storage part 410 may include a first storage part and a second storage part. The first storage part and the second storage part may be connected to the first discharge port 420a and the second discharge port 420b, respectively.

In an embodiment, the first adhesive layer 630 may be formed by providing the first adhesive composition on the lower deposition layer 620 through the first discharge port 420a. However, the embodiments are not limited thereto, and the first adhesive layer 630 may be formed by providing the first adhesive composition on the lower deposition layer 620 through the second discharge port 420b. In an embodiment, the viscosity of the first adhesive composition may be about 5 cP to about 40 cP. However, the viscosity of the first adhesive composition is not limited thereto. In an embodiment, the minimum thickness of the first adhesive layer 630 may be about 5 μm. A surface of the lower deposition layer 620 in contact with the first adhesive layer 630 may be modified. For example, the modification may include a plasma surface treatment. The modification may also include a corona discharge treatment.

Figure 4B:
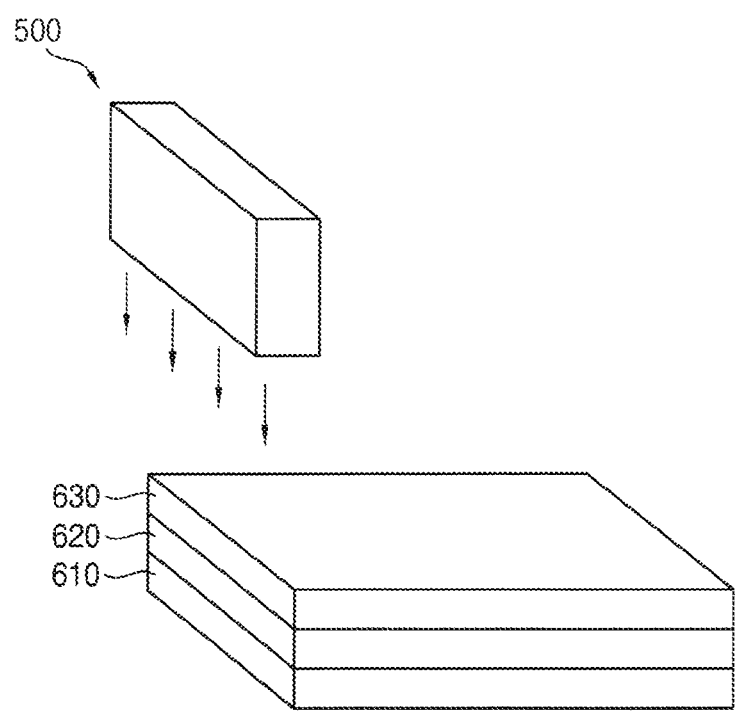

Referring to FIG. 4B, the first adhesive layer 630 may be formed by curing the first adhesive composition in a liquid or semi-solid state. In an embodiment, the first adhesive layer 630 may be formed by photocuring. The first adhesive composition may be cured when the first adhesive composition including the photocurable material such as the photoinitiator is irradiated with light such as ultraviolet rays. A lamp 500 may firstly cure the first adhesive composition by irradiating the light. In an embodiment, the lamp 500 may firstly cure the first adhesive composition using the ultraviolet rays. In an embodiment, the providing of the first adhesive composition and the firstly curing of the first adhesive composition may be performed simultaneously. For example, the first adhesive composition may be firstly cured about 50% to about 70%.

Figure 4C:
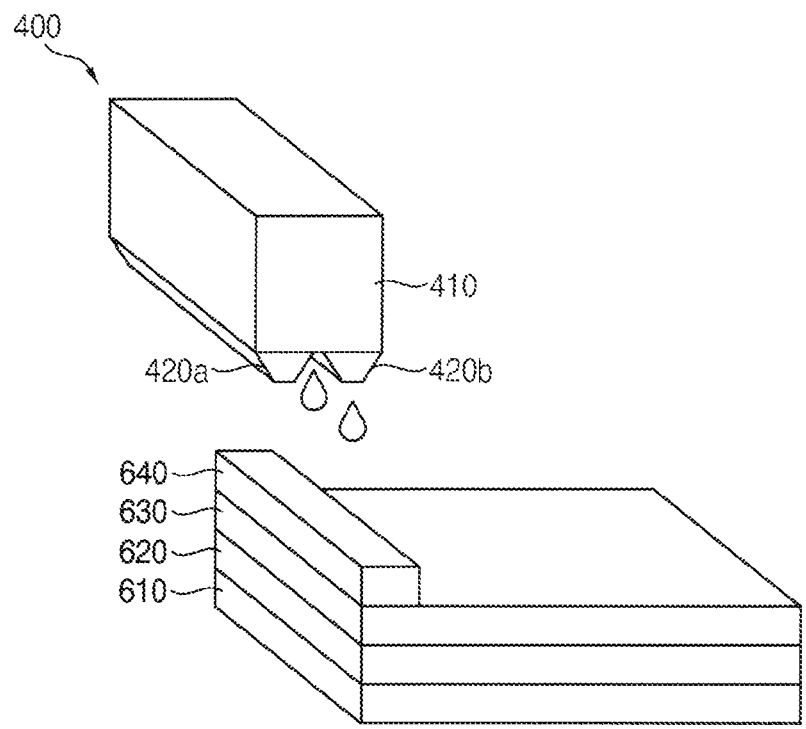

Referring to FIG. 4C, the discharge device 400 may form the second adhesive layer 640 by providing the second adhesive composition on the first adhesive layer 630. The second adhesive layer 640 may be made of a transparent material. For example, the second adhesive layer 640 may be formed of an optically transparent resin (OCR), an optically transparent adhesive (OCA), or a combination thereof. The second adhesive layer 640 may include the photocurable material. In an embodiment, the second adhesive layer 640 may include an epoxy acrylate resin, a polyester acrylate resin, a urethane acrylate resin, a polybutadiene acrylate resin, silicone acrylate resin, alkyl acrylate resin, and the like. However, the embodiments are not limited thereto, and the second adhesive layer 640 may include other adhesive materials as well. In an embodiment, the second adhesive layer 640 may include a hydrophilic material or a hydrophobic material (e.g., fluoride) to control the surface energy of the second adhesive layer 640. The hydrophilic material may increase the surface energy of the second adhesive layer 640. The hydrophobic material may lower the surface energy of the second adhesive layer 640.

In an embodiment, when the first adhesive composition is provided through the first discharge port 420a, the discharge device 400 may form the second adhesive layer 640 by providing the second adhesive composition having the second surface energy on the first adhesive layer 630 through the second discharge port 420b. In an embodiment, when the first adhesive composition is provided through the second discharge port 420b, the discharge device 400 may form the second adhesive layer 640 by providing the second adhesive composition having the second surface energy on the first adhesive layer 630 through the first discharge port 420a. In an embodiment, the viscosity of the second adhesive composition may be about 5 cP to about 40 cP. However, the viscosity of the second adhesive composition is not limited thereto. In an embodiment, the minimum thickness of the second adhesive layer 640 may be about 5 μm.

Figure 4D:
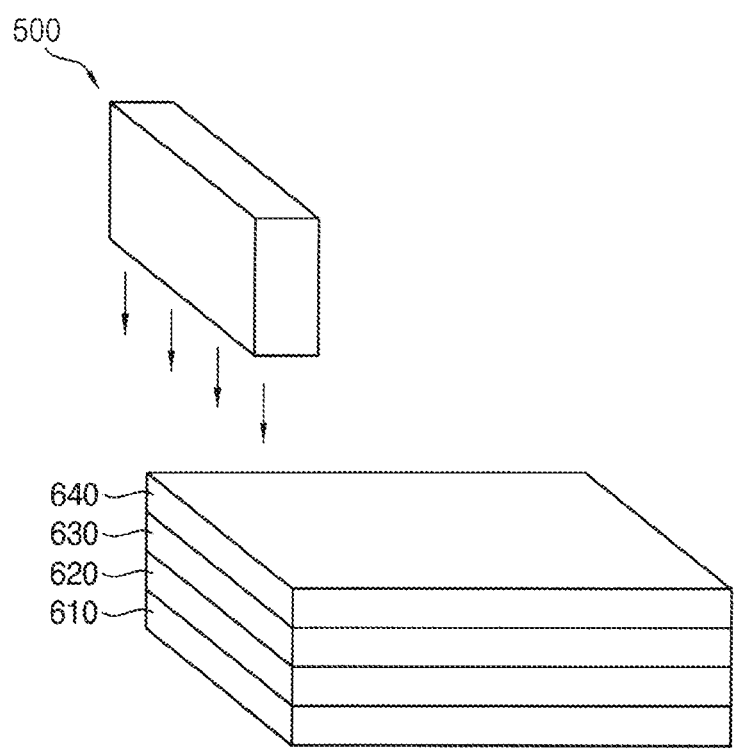

Referring to FIG. 4D, the second adhesive layer 640 may be formed by curing the second adhesive composition in a liquid or semi-solid state. In an embodiment, the second adhesive layer 640 may be formed by photocuring. For example, the second adhesive composition may include the photocurable material. In an embodiment, the lamp 500 may firstly cure the second adhesive composition by irradiating the light. In an embodiment, the providing of the second adhesive composition and the firstly curing of the second adhesive composition may be performed simultaneously. For example, the second adhesive composition may be firstly cured about 50% to about 70%.

In an embodiment, after firstly curing the second adhesive layer 640, the first adhesive layer 630 and the second adhesive layer 640 may be secondly cured. The secondly curing of the first adhesive layer 630 and the second adhesive layer 640 may be performed by irradiating the light. The secondly curing of the of the first adhesive layer 630 and the second adhesive layer 640 may be performed using ultraviolet rays. For example, the first adhesive layer 630 and the second adhesive layer 640 may be cured about 50% to about 70% through the first curing. Thereafter, the first adhesive layer 630 and the second adhesive layer 640 may be cured about 90% to about 95% through the second curing. However, the embodiments are not limited thereto, and the first adhesive layer 630 and the second adhesive layer 640 may be cured about 95% or more through the second curing.

Figure 4E:
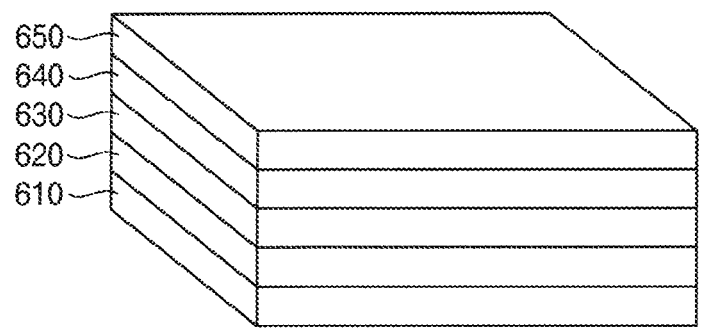

Referring to FIG. 4E, an upper deposition layer 650 may be formed on the second adhesive layer 640. The upper deposition layer 650 may include a window. In an embodiment, a surface of the upper deposition layer 650 in contact with the second adhesive layer 640 may be modified. For example, the modification may include a plasma surface treatment. The modification may also include a corona discharge treatment.

The smaller the difference in surface energy between the adhesive layer and the deposition layer (e.g., the lower deposition layer 620 and the first adhesive layer 630), the better for adhesion. In an embodiment, an absolute value of the difference between the surface energy of the lower deposition layer 620 and the surface energy of the first adhesive layer 630 may be smaller than an absolute value of the difference between the surface energy of the lower deposition layer 620 and the surface energy of the second adhesive layer 640. An absolute value of the difference between the surface energy of the upper deposition layer 650 and the surface energy of the second adhesive layer 640 may be smaller than an absolute value of the difference between the surface energy of the upper deposition layer 650 and the surface energy of the first adhesive layer 630.

The lower deposition layer 620 and the upper deposition layer 650 can be more effectively adhered to each other than when the lower deposition layer 620 and the upper deposition layer 650 are adhered using a single adhesive layer. By lowering the difference between the surface energy of the lower deposition layer 620 and the surface energy of the first adhesive layer 630, the lower deposition layer 620 and the first adhesive layer 630 can be effectively adhered to each other. By lowering the difference between the surface energy of the upper deposition layer 650 and the surface energy of the second adhesive layer 640, the upper deposition layer 650 and the second adhesive layer 640 can be effectively adhered to each other. In an embodiment, the difference in surface energy between the adhesive layers and the deposition layers may be adjusted through the modifications.

In an embodiment, a method of manufacturing the display device may modify the surface of the lower deposition layer 620 in contact with the first adhesive layer 630. In an embodiment, the method of manufacturing the display device may modify the surface of the upper deposition layer 650 in contact with the second adhesive layer 640. In an embodiment, the method of manufacturing the display device may modify the surface of the lower deposition layer 620 in contact with the first adhesive layer 630 and the upper deposition layer 650 in contact with the second adhesive layer 640.

According to embodiments, the adhesive layer may be determined based on a contact angle in order to maximize adhesion between the adhesive layer and the layer to be adhered to each other. In an embodiment, a contact angle between the first adhesive composition and the lower deposition layer may be about 10 degrees or less, and a contact angle between the second adhesive composition and the upper deposition layer may be about 10 degrees or less.

As the contact angle between the adhesive layer and the layer to be adhered is smaller, the difference in surface energy between the adhesive layer and the layer to be adhered may be generally smaller.

The display device and the method of manufacturing the display device according to the embodiments may be applied to a display device included in a computer, a notebook, a mobile phone, a smartphone, a smart pad, a PMP, a PDA, an MP3 player, or the like.

Although the embodiments have been described, it is understood that the invention should not be limited to these embodiments, but various changes and modifications can be made by one ordinary skilled in the art within the spirit and scope of the invention as hereinafter claimed. Hence, the real protective scope of the invention shall be determined by the technical scope of the accompanying claims.

What is claimed is:

1. A display device, comprising:
    a display panel;
    a lower deposition layer disposed on the display panel;
    a first adhesive layer disposed on the lower deposition layer;
    a second adhesive layer disposed on the first adhesive layer, the second adhesive layer having a surface energy different than a surface energy of the first adhesive layer, a surface energy being an attractive force present between molecules at a surface of a solid substance; and
    an upper deposition layer disposed on the second adhesive layer, wherein
    an absolute value of a difference between a surface energy of the lower deposition layer and the surface energy of the first adhesive layer is less than an absolute value of a difference between the surface energy of the lower deposition layer and the surface energy of the second adhesive layer, and
    an absolute value of a difference between a surface energy of the upper deposition layer and the surface energy of the second adhesive layer is less than an absolute value of a difference between the surface energy of the upper deposition layer and the surface energy of the first adhesive layer,
    wherein the first adhesive layer and the second adhesive layer include an acrylic composition, and at least one of the first adhesive layer and the second adhesive layer includes at least one of a hydrophilic material and a hydrophobic material to control and modify the surface energy of the at least one of the first adhesive layer and the second adhesive layer.

2. The display device of claim 1, wherein
    the lower deposition layer includes a polarizing layer, and the upper deposition layer includes a window.

3. The display device of claim 1, wherein
    the lower deposition layer includes:
    a polarizing layer; and
    a buffer layer disposed on the polarizing layer, and the upper deposition layer includes a window.

4. The display device of claim 1, wherein
    a minimum thickness of the first adhesive layer is about 5 μm, and a minimum thickness of the second adhesive layer is about 5 μm.

5. The display device of claim 1, wherein a thickness ratio of a thickness of the first adhesive layer and a thickness of the second adhesive layer is in a range of about 1:19 to about 19:1.

6. A method of manufacturing a display device, the method comprising:
    forming a lower deposition layer on a display panel;
    forming a first adhesive layer on the lower deposition layer;
    forming a second adhesive layer on the first adhesive layer; and
    forming an upper deposition layer on the second adhesive layer, wherein
    the second adhesive layer has a surface energy that is different than a surface energy of the first adhesive layer, a surface energy being an attractive force present between molecules at a surface of a solid substance,
    an absolute value of a difference between a surface energy of the lower deposition layer and the surface energy of the first adhesive layer is less than an absolute value of a difference between the surface energy of the lower deposition layer and the surface energy of the second adhesive layer, and an absolute value of a difference between a surface energy of the upper deposition layer and the surface energy of the second adhesive layer is less than an absolute value of a difference between the surface energy of the upper deposition layer and the surface energy of the first adhesive layer, wherein the first adhesive layer and the second adhesive layer include an acrylic composition, and at least one of the first adhesive layer and the second adhesive layer includes at least one of a hydrophilic material and a hydrophobic material to control and modify the surface energy of the at least one of the first adhesive layer and the second adhesive layer.

7. The method of claim 6, wherein the forming of the first adhesive layer comprises:

providing a first adhesive composition on the lower deposition layer; and firstly curing the first adhesive composition.

8. The method of claim 7, wherein the forming of the second adhesive layer comprises:

providing a second adhesive composition on the first adhesive layer; and firstly curing the second adhesive composition.

9. The method of claim 8, further comprising secondly curing the first adhesive layer and the second adhesive layer.

10. The method of claim 9, wherein the firstly curing of the first adhesive composition, the firstly curing of the second adhesive composition, and the secondly curing of the first adhesive layer and the second adhesive layer are performed using ultraviolet rays.

11. The method of claim 6, further comprising:

modifying a surface of the lower deposition layer before the forming of the first adhesive layer, the surface of the lower deposition layer contacting the first adhesive layer.

12. The method of claim 6, further comprising:

modifying a surface of the upper deposition layer before the forming of the upper deposition layer on the second adhesive layer, the surface of the upper deposition layer contacting the second adhesive layer.

13. The method of claim 6, further comprising:

modifying a surface of the lower deposition layer before the forming of the first adhesive layer, the surface of the lower deposition layer contacting the first adhesive layer; and modifying a surface of the upper deposition layer before the forming of the upper deposition layer on the second adhesive layer, the surface of the upper deposition layer contacting the second adhesive layer.

14. The method of claim 6, wherein the forming of the first adhesive layer and the forming of the second adhesive layer are performed through an inkjet printing process.

15. The method of claim 14, wherein the inkjet printing process is performed using a discharge device including a first discharge port for discharging the first adhesive composition and a second discharge port for discharging the second adhesive composition.

16. The method of claim 15, wherein the discharge device includes:

a first storage part connected to the first discharge port; and a second storage part connected to the second discharge port.

17. The method of claim 6, wherein each of a viscosity of the first adhesive composition and a viscosity of the second adhesive composition is about 5 cP to about 40 cP.

18. The method of claim 6, wherein a contact angle between the first adhesive composition and the lower deposition layer is about 10 degrees or less.

19. The method of claim 6, wherein a contact angle between the second adhesive composition and the upper deposition layer is about 10 degrees or less.

* * * * *